United States Patent
Murayama

[11] Patent Number: 6,115,783
[45] Date of Patent: Sep. 5, 2000

[54] INTEGRATED CIRCUIT

[75] Inventor: Tohru Murayama, Tokyo, Japan

[73] Assignee: NEC Corporation, Tokyo, Japan

[21] Appl. No.: 08/911,935

[22] Filed: Aug. 15, 1997

[30] Foreign Application Priority Data

Aug. 15, 1996 [JP] Japan .................................. 8-233621

[51] Int. Cl.[7] .................................................. G06F 12/00
[52] U.S. Cl. ........................ 711/100; 711/167; 711/219; 714/719
[58] Field of Search ............................... 711/1, 100, 167, 711/173; 395/183.18; 714/719, 718

[56] References Cited

U.S. PATENT DOCUMENTS

| | | |
|---|---|---|
| 3,805,152 | 4/1974 | Ebersman et al. . |
| 4,949,242 | 8/1990 | Takeuchi et al. . |
| 5,018,145 | 5/1991 | Kikuchi et al. ........................ 714/743 |
| 5,636,225 | 6/1997 | Osawa ..................................... 714/719 |
| 5,704,035 | 12/1997 | Shipman ............................ 395/183.18 |
| 5,892,776 | 4/1999 | Kumakura ................................. 714/718 |
| 5,910,181 | 6/1999 | Hatakenaka et al. .................... 714/718 |

FOREIGN PATENT DOCUMENTS

| | | |
|---|---|---|
| 48-26036 | 4/1973 | Japan . |
| 62-120698 | 6/1987 | Japan . |
| 64-25400 | 1/1989 | Japan . |
| 3-30200 | 2/1991 | Japan . |
| 4-274100 | 9/1992 | Japan . |
| 9-91995 | 4/1997 | Japan . |

OTHER PUBLICATIONS

IBM Technical Disclosure Bulletin, vol. 32, No. 4A, Pg. 434/435, "Performance Self–Test for High Performance Random–Access Memories", dated Sep. 1989.

*Primary Examiner*—Do Hyun Yoo
*Assistant Examiner*—Nasser Moazzami
*Attorney, Agent, or Firm*—Scully, Scott, Murphy & Presser

[57] ABSTRACT

In order to precisely measure the speed of memory unit, the memory unit stores at least one bit data at a predetermined bit position at each memory word such that the logical value of the one bit data changes alternately in order of memory address. An address increment circuit, which is provided in a module including the memory unit, successively generates memory addresses which are applied to the memory. The address increment circuit increments a memory address in response to the output of the memory. The memory speed between two consecutive memory outputs is detected by measuring a pulse width of a pulse signal outputted from the memory unit. Thus, a relatively large delay otherwise caused at a buffer amplifier can effectively be compensated.

7 Claims, 6 Drawing Sheets

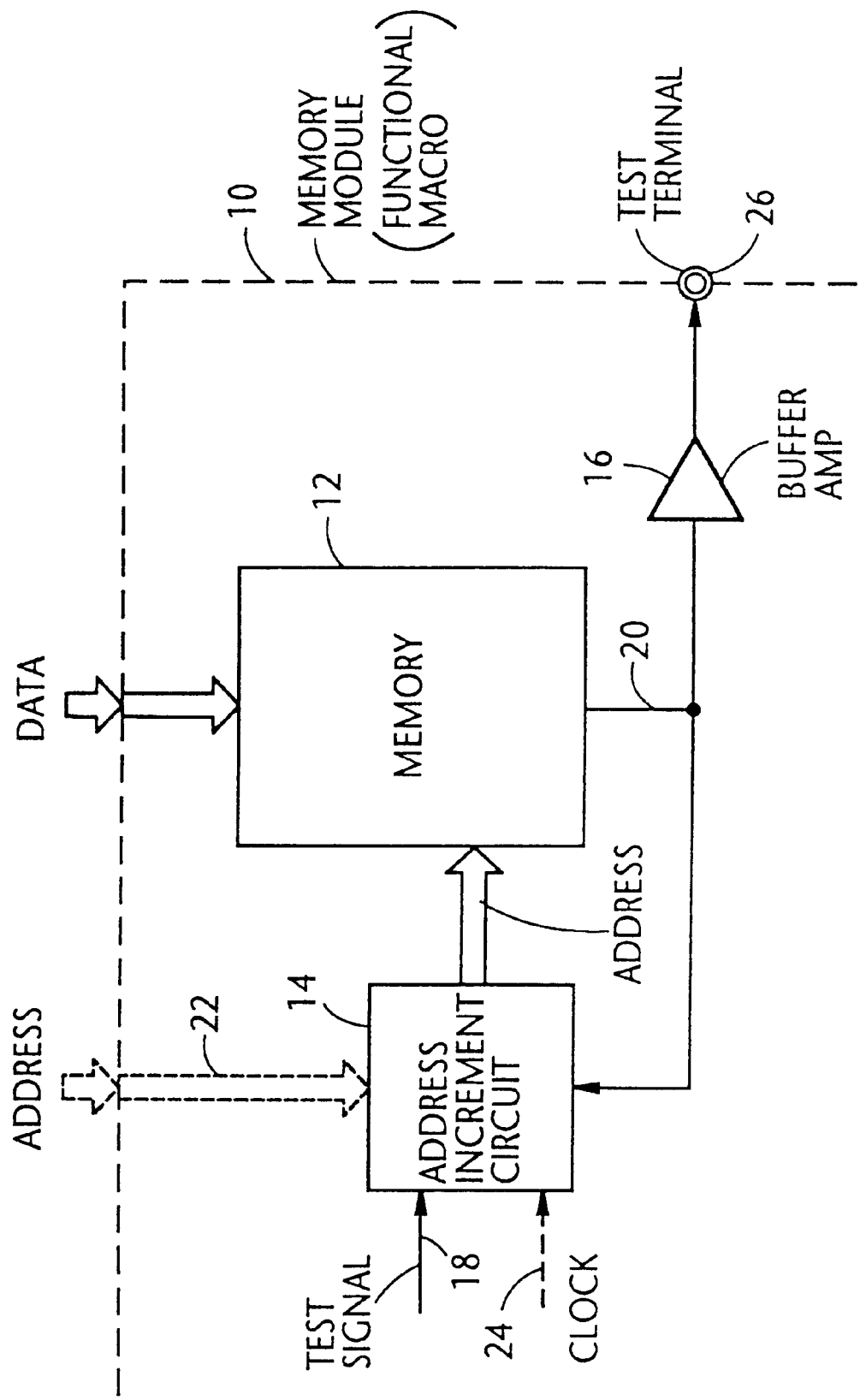

FIG. 2A

| MEMORY ADDRESS | DATA |
|---|---|
| 0 0 0 H | 1 1 1 ... 1 1 |
| 0 0 1 H | 0 0 0 ... 0 0 |
| 0 0 2 H | 1 1 1 ... 1 1 |
| 0 0 3 H | 0 0 0 ... 0 0 |
| 0 0 4 H | 1 1 1 ... 1 1 |
| . | . |
| . | . |
| . | . |

FIG. 2B

| MEMORY ADDRESS | DATA |
|---|---|
| 0 0 0 H | * * 1 ... * * |
| 0 0 1 H | * * 0 ... * * |
| 0 0 2 H | * * 1 ... * * |
| 0 0 3 H | * * 0 ... * * |
| 0 0 4 H | * * 1 ... * * |
| . | . |
| . | . |
| . | . |

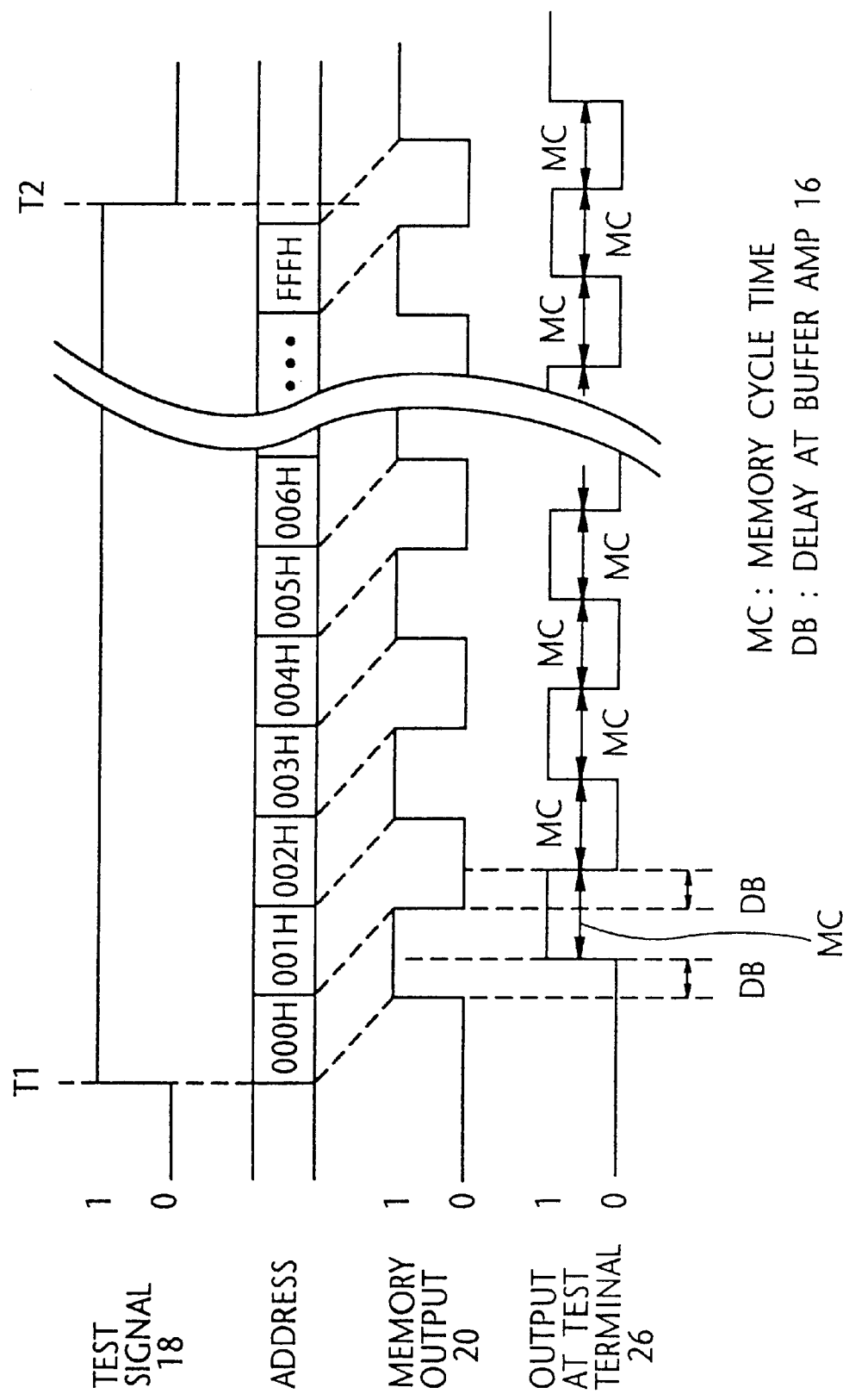

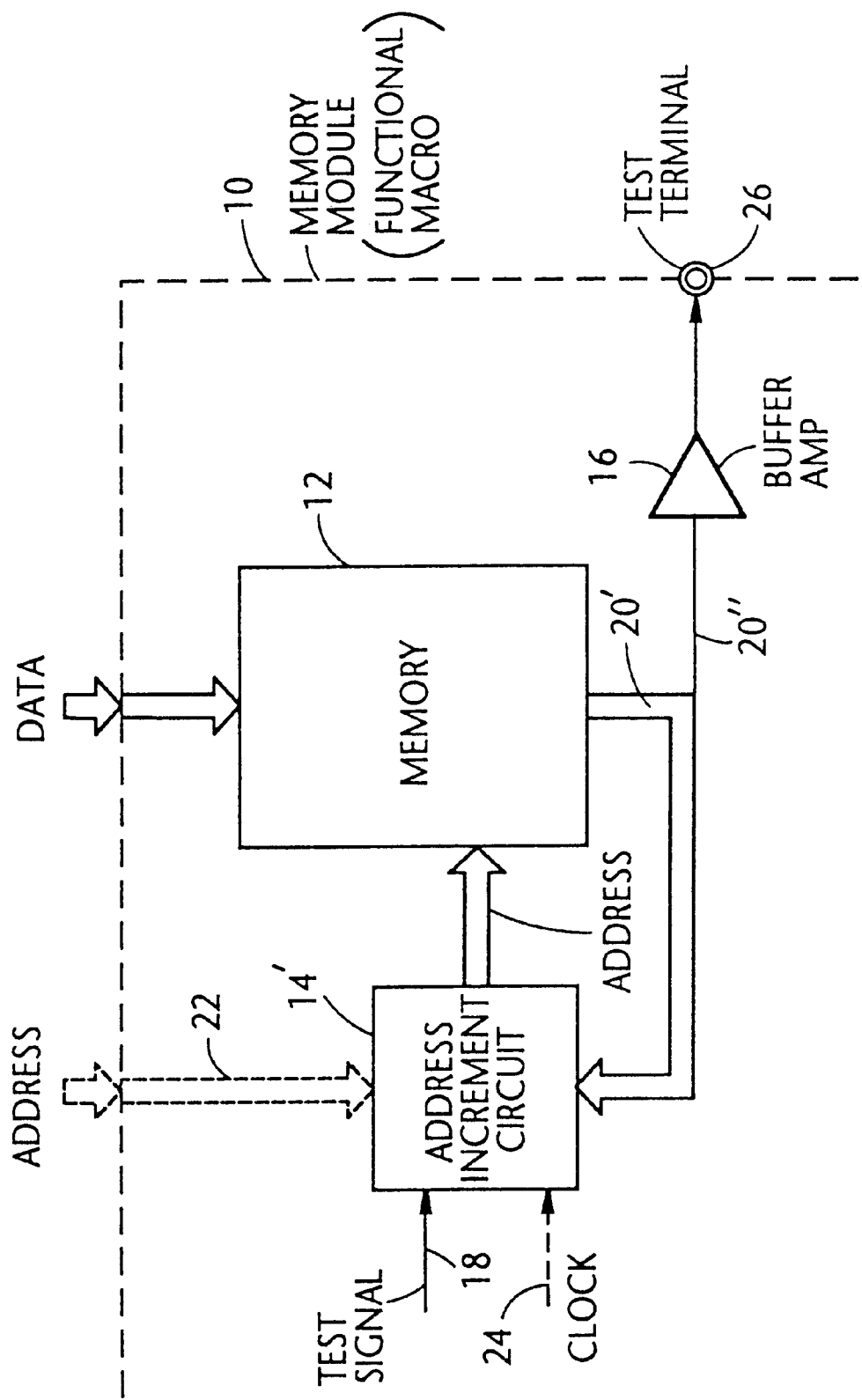

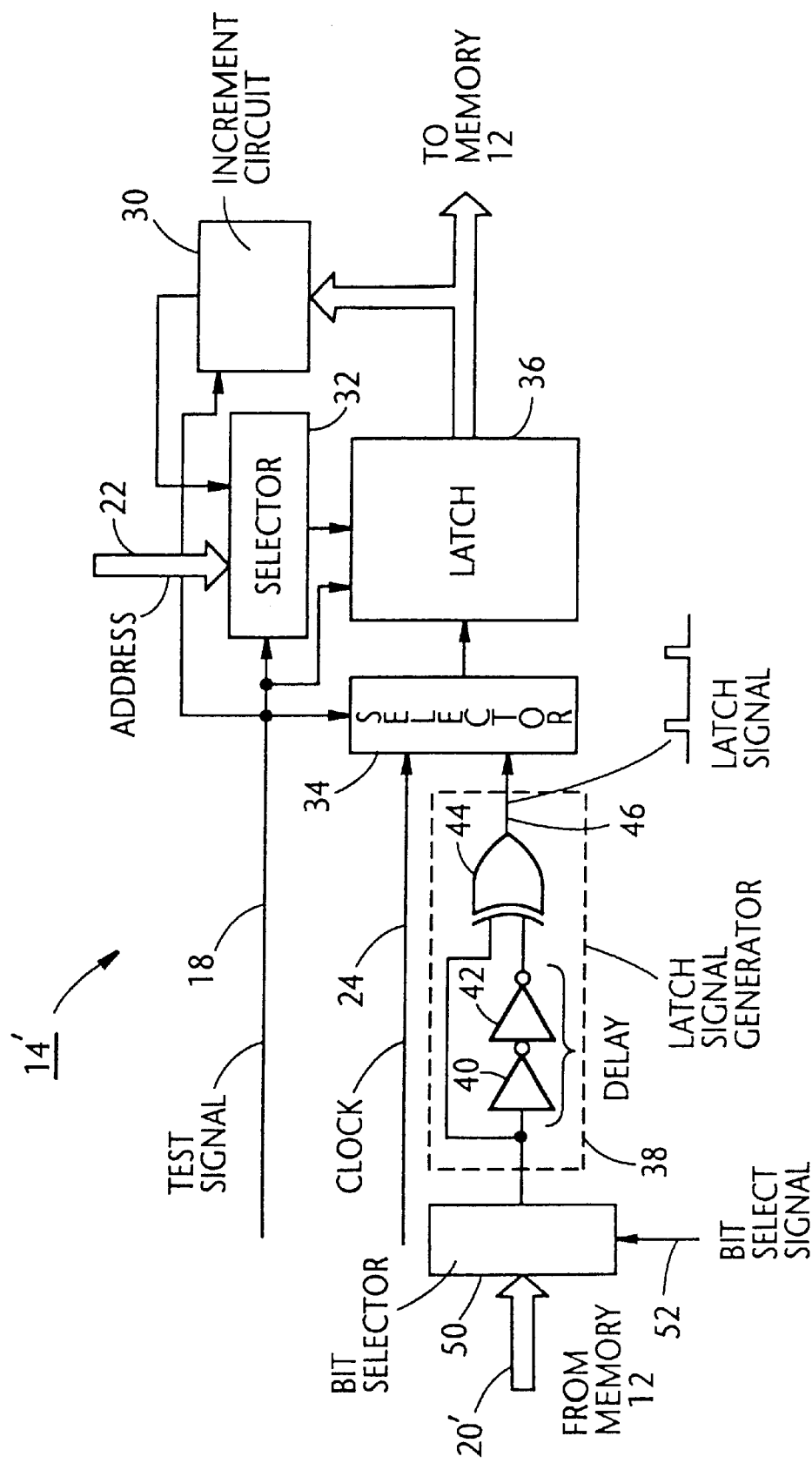

INTEGRATED CIRCUIT

BACKGROUND OF THE INVENTION

1. Field of the Invention

The present invention relates generally to techniques for measuring the speed of memory unit in an integrated circuit (IC), and more specifically to a built-in hardware arrangement for measuring a time interval between two consecutive outputs of the memory unit.

2. Description of the Related Art

As is known in the art, it is very important to precisely determine the speed of memory unit that is provided in an IC. A useful measure of the speed of memory unit is the time that elapses between the initiation of an operation and the completion of that operation. This is referred to as the memory access time. Another important measure is the memory cycle time, which is the minimum time delay required between the initiation of two successive memory operations.

One known technique of measuring the speed of IC memory is to successively apply memory addresses from external and detect each memory output. An IC tester is used to measure the time delay between the application of each address and the detection of the data derived from the memory. As is known, a buffer amplifier is provided between the memory and the output pins. This buffer amplifier unit inherently provides a relatively large amount of delay before the data is derived from the memory unit via the IC output pins. Thus, with the above mentioned method, it is very difficult to accurately measure the speed of memory unit.

Another approach to measuring the memory speed is to provide a memory speed measuring unit within an IC memory itself. One example of such techniques is disclosed in Japanese Laid-open Patent Application No. 4-274100. According to this conventional technique, a plurality of delay elements are incorporated in an IC memory module to determine a memory access time. However, this technique detects a memory access time at a time interval which is determined by the delay elements and accordingly, it is not expected to precisely determine the speed of memory unit.

SUMMARY OF THE INVENTION

It is therefore an object of the present to provide a hardware arrangement that is built in a memory module and is able to accurately measure the speed of memory.

Another object of the present invention is to provide a method of accurately measuring the speed of memory using a built-in measuring hardware.

In brief, these objects are achieved by a technique wherein in order to precisely measure the speed of memory unit, the memory unit stores at least one bit data at a predetermined bit position at each memory word. That is, the logical value of the one bit data changes alternately in order of memory address. An address increment circuit, which is provided in a module including the memory unit, successively generates memory addresses which are applied to the memory. The address increment circuit increments a memory address in response to the output of the memory. The memory speed between two consecutive memory outputs is detected by measuring a pulse width of a pulse signal outputted from the memory unit. Thus, a relatively large delay otherwise caused at a buffer amplifier can effectively be compensated.

BRIEF DESCRIPTION OF THE DRAWINGS

The features and advantages of the present invention will become more clearly appreciated from the following description taken in conjunction with the accompanying drawings in which like elements are denoted by like reference numerals and in which:

FIG. 1 is a block diagram showing a general arrangement of a first embodiment of the present invention;

FIGS. 2A and 2B are each a table showing memory addresses and data stored thereat;

FIG. 3 is a timing diagram for use in describing the operation of the arrangement of FIG. 1;

FIG. 5 is a block diagram showing a general arrangement of a second embodiment of the present invention; and FIG. 6 is a block diagram showing a detail of a block of FIG. 5.

DETAILED DESCRIPTION OF THE PREFERRED EMBODIMENTS

Figure 4:
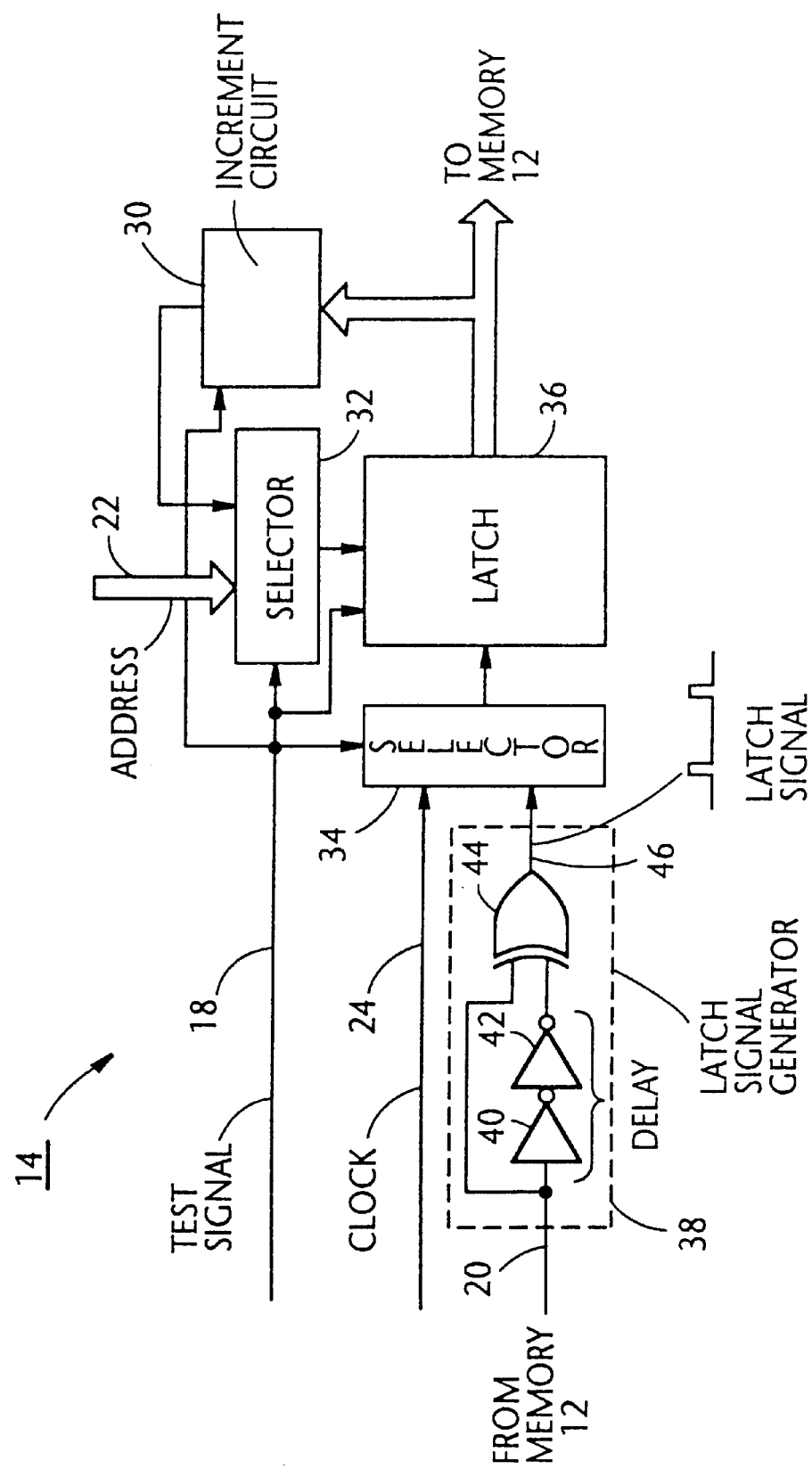
FIG. 4 is a block diagram showing a detail of a block of FIG. 1.

Reference is now made to FIG. 1, wherein a first embodiment of the present invention is generally illustrated in block diagram form. It is to be noted that FIG. 1 shows only an arrangement that is directly concerned with the memory speed measurement according to the present invention. Accordingly, a various terminals of a memory array, which are used in a normal operation and well known in the art, are not shown for the sake of simplifying the disclosure.

The arrangement of FIG. 1 will be described together with FIGS. 2A, 2B and 3. As shown in FIG. 1, a memory module (or functional memory macro) 10 includes an asynchronous type memory (or memory array) 12, an address increment circuit 14, and a buffer amplifier 16. The memory 12 takes the form of RAM (random access memory), ROM (read only memory), etc. When the speed of the memory 12 is to be measured, two kinds of data (viz., all "1"s and all "0"s) are alternately stored in the storage words of the memory 12 in order of memory addresses, as shown in FIG. 2A. The data writing of all "1"s and all "0" is implemented in a manner known to those skilled in the art. In FIG. 2A, an alphabet H attached to each memory address indicates that the address is represented in hexadecimal notation. The memory word length itself is not concerned with the present invention.

In order to initiate the memory speed measurement, a test signal 18 is applied to the address incrementing circuit 14 at a time point T1 (FIG. 3). The test signal 18 sets the circuit 14 such as to select an output 20 of the memory array 12 in place of an address bus 22 and a clock line 24. In order to clearly indicate that the address bus 22 and the clock line 24 are not used in the memory speed measurement, they are shown by broken lines. Thereafter, the address increment circuit 14 applies the first address "000H" to the memory 12, which outputs all "1" data at the data output terminals of the memory 12. One bit data among the whole data issued from the memory 12 is applied to the address incrementing circuit 14 and also to the buffer amplifier 16. Since the data outputted from the memory array 12 exhibits all "1"s or all "0"s, the aforesaid one bit data is arbitrarily selected when designing the memory speed measuring arrangement shown in FIG. 1.

The operation of the arrangement of FIG. 1 is further described with reference to FIG. 3. The circuit 14 of FIG. 1, in response to the bit data indicating "1" fed thereto from the memory 12, applies the next memory address "001H" to the memory 12. Thus, the circuit 14 in turn receives a bit data indicating "0", in response to which the circuit 14 applies the next memory address "002H" to the memory 12. These operations are repeated until the test signal 18 is terminated as at a time point T2 (FIG. 3).

As mentioned above, the memory bit data is also applied to the buffer amplifier 16, the output of which is delayed thereat and appears at a test terminal 26. The data at the terminal 26 assumes alternately a high and low logic levels (viz., "1" and "0"), as shown in the bottom row of FIG. 3. This pulse signal appearing at the test terminal 16 is then applied to a suitable test equipment (not shown), which measures the pulse width which corresponds to a memory cycle time (denoted by MC). In the instant disclosure, the memory cycle time implies a time interval between two consecutive memory outputs. It is understood that the delay at the buffer amplifier 16 is effectively canceled by measuring the pulse width.

FIG. 4 is a block diagram showing a detail of the address increment circuit 14 of FIG. 1. As shown in FIG. 4, the arrangement comprises an increment circuit 30, two selectors 32 and 34, a latch 36, and a latch signal generator 38. Further, the generator 38 includes two inverters 40 and 42, and an exclusive-or gate 44.

When the speed of the memory 12 (FIG. 1) is to be measured, the test signal 18 is applied to the address increment circuit 14 of FIG. 4. The selector 32, in response to the test signal 18 that assumes a high logic level, continues to select an output of the increment circuit 30 instead of the external address signal via the address bus 22. Likewise, the other selector 34 responds to the test signal 18 (assuming the high logic level) and selects the output of the latch signal generator 38 in place of the clock 24. When the test signal 18 assumes the high logic level, the increment circuit 30 is reset and issues the first address signal "001H". The latch 36 responds to the test signal 18 assuming the high logic level and latches the first address "000H", which is thus applied to the memory 12. Further, the increment circuit 30 responds to the issuance of the address signal from the latch 36 and increments the address to "001H" in the instant stage.

Thereafter, the bit data "1" outputted from the memory 12 is applied to the latch signal generator 38. It is assumed that the latch signal generator 38 is initially supplied with a logic level "1". The serially coupled inverters 40 and 42 serve as a delay circuit. Accordingly, when the input to the generator 38 changes from "0" to "1", a pulse is generated from the exclusive-OR gate 44 and; has a very narrow pulse width. Likewise, when the input to the generator 38 changes from "0" to "1", the same pulse as mentioned above is also generated from the gate 44. The output of the gate 44 is referred to as a latch signal 46. Summing up, as the bit data 20 changes from "1" to "0" or vise versa, a pulse having a narrow width is generated as indicated in FIG. 4. Each pulse width of the latch signal 46, which is determined by the delay provided by the two inverters 40 and 42, has a very small value and may be negligible in the measurement of memory speed.

The latch 36 responds to the rising edge of the latch signal 46 and latches the next address "001H", which is applied to the memory 12. As mentioned above, the increment circuit 30 responds to the newly latched address and increments the content thereof to "002H" in the instant case. These operations are iterated until the test signal 18 is terminated (viz., assumes a low logic level).

In the above description, all "1" and all "0" data are alternately stored in the memory addresses starting with the first address "000H". However, it is possible to alternately all "0" and all "1" data from the first address "000H". In this case, an inverter is added before the latch signal generator 38, while another inverter is added before the buffer amplifier 16.

In the first embodiment, only one bit data is required from the memory 12. Therefore, there is no need fur storing all "1" and all "0" data in the memory words. That is to say, as shown in FIG. 2B, it is sufficient to alternately store "1" and a "0" bit data at a predetermined bit position of each memory word. In FIG. 2B, an asterisk indicates that the bit data may take any logic value (viz., "1" or "0").

A second embodiment of the present invention is described with reference to FIGS. 5 and 6.

The second embodiment differs from the first one in that the former embodiment is provided with an address increment circuit 14' that receives a plurality of bit signals (denoted by 20') from the memory 12 and then selects one bit signal among them. The buffer amplifier 16 receives one bit signal (denoted by 20") among the bit signals 20'. Other than this, the second embodiment is identical to the first embodiment. FIG. 6 shows a detail of the address increment circuit 14'. As shown, there is provided a bit selector 50 in front of the latch signal generator 38. The bit selector 50 is supplied with the output 20' of the memory 12 and select one bit using a bit select signal 52. The remaining portions of FIG. 6 are identical to those of FIG. 4 and thus, further description thereof will be omitted for brevity.

It will be understood that the above disclosure is representative of only two possible embodiments of the present invention and that the concept on which the invention is based is not specifically limited thereto.

What is claimed is:

1. A hardware arrangement which is built into a memory module to accurately measure the speed of a memory unit, wherein, a. the memory module includes the memory unit, which has stored therein a plurality of consecutive memory words, wherein each memory word stores at least one bit data at a predetermined bit position, and wherein the logical value of the at least one bit data changes alternately between a zero and a one in consecutive memory words stored in the memory unit in order of memory address;

b. the memory module further includes an address increment circuit for generating a memory address which is applied to the memory unit, and the address increment circuit increments the memory address in response to the at least one bit data read out from the memory unit, such that consecutive words are read out from the memory unit, and each consecutive word causes the address increment circuit to increment the memory address; and c. the memory module receives inputs from an address bus and a clock line, which are used to read data from the memory unit, and to initiate a measurement of the speed of the memory unit, a test signal is applied to the address increment circuit at a first time point, which sets the address increment circuit to select an output of the memory unit in place of the address bus and the clock line, such that the address bus and the clock line are not used in the memory speed measurement, and thereafter the address increment circuit applies a first address to the memory unit, and in response to a first word read out from the first address of the memory unit, the address increment circuit applies the next memory address to the memory unit, which operation is repeated until the test signal is terminated at a second time point.

2. A hardware arrangement built into a memory module as claimed in claim 1, wherein the memory module comprises an integrated circuit.

3. A hardware arrangement built into a memory module as claimed in claim 1, wherein the memory module further comprises a buffer amplifier, provided between the output of the memory unit and the memory module output, which buffer amplifier provides an inherent delay before data read out from the memory unit is available at the memory module output.

4. A hardware arrangement built into a memory module as claimed in claim 3, wherein the time between two consecutive outputs of the memory unit is detected by measuring the pulsewidth of a pulse signal outputted from the memory unit, such that the delay at the buffer amplifier is effectively canceled by measuring the pulsewidth.

5. A hardware arrangement built into a memory module as claimed in claim 4, wherein the output signal at the memory module output assumes alternately high and low logic levels, and the measured pulsewidth corresponds to a memory cycle time.

6. A hardware arrangement built into a memory module as claimed in claim 1, wherein the address increment circuit comprises an increment circuit, first and second selectors, a latch, and a latch signal generator, and to measure the speed of the memory unit, a test signal is applied to the address increment circuit, which causes the first selector to select an output of the increment circuit in place of the external address signal via the address bus, and causes the second selector to select the output of the latch signal generator in place of the clock.

7. A hardware arrangement built into a memory module as claimed in claim 1, further comprising an amplifier coupled to receive the at least one bit data, an output of said amplifier being applied to an output terminal of the memory module.

* * * * *